United States Patent [19]
Ohtaki

[11] Patent Number: 5,300,163
[45] Date of Patent: Apr. 5, 1994

[54] PROCESS FOR FABRICATING A MULTILAYER CERAMIC CIRCUIT BOARD

[75] Inventor: Shiro Ohtaki, Yokohama, Japan
[73] Assignee: Asahi Glass Company Ltd., Tokyo, Japan
[21] Appl. No.: 913,049
[22] Filed: Jul. 14, 1992

Related U.S. Application Data

[63] Continuation of Ser. No. 589,215, Sep. 28, 1990, Pat. No. 5,176,772.

[30] Foreign Application Priority Data

Oct. 5, 1989 [JP] Japan ................. 1-258676
Oct. 5, 1989 [JP] Japan ................. 1-258677

[51] Int. Cl.$^5$ ............................................. B32B 31/26
[52] U.S. Cl. .......................... 156/89; 264/61; 427/96
[58] Field of Search ............... 156/89; 264/61; 427/96

[56] References Cited

U.S. PATENT DOCUMENTS

| | | | |
|---|---|---|---|
| 4,478,884 | 10/1984 | Barnes et al. | 427/97 |
| 4,645,552 | 2/1987 | Vitriol et al. | 156/89 |
| 4,799,984 | 1/1989 | Rellick | 156/89 |
| 4,883,705 | 11/1989 | Kawakami et al. | 428/209 |
| 5,028,473 | 7/1991 | Vitriol et al. | 428/137 |

FOREIGN PATENT DOCUMENTS

6081342 6/1983 European Pat. Off. .

OTHER PUBLICATIONS

IMC 1982 Proceedings, May 24-26, 1982, Tokyo, Japan, pp. 388-393, N. Kamehara, et al., "Packaging Material for High Speed Computers".

*Primary Examiner*—Jan H. Silbaugh
*Assistant Examiner*—Christopher A. Fiorilla
*Attorney, Agent, or Firm*—Oblon, Spivak, McClelland, Maier & Neustadt

[57] ABSTRACT

A process for fabricating a multilayer ceramic circuit board which includes the steps of (i) providing a sintered ceramic substrate having optionally formed via holes already filled with a conductive paste or a conductive substance, (ii) optionally applying an insulating paste layer in a prescribed pattern on one side or each side of the ceramic substrate, (iii) then, providing a ceramic green tape and forming via holes in the green tape, (iv) applying a conductive paste to form a conductive pattern on one side of the green tape, (v) laminating the green tape to one side or each side of the ceramic substrate so that the conductive pattern of the green tape faces the substrate, (vi) optionally pressing and heating the laminate from step (v), and (vii) applying a conductive paste to form a conductive pattern on the other side of the green tape and filling the via holes of the green tape with a conductive paste, before or after step (v).

9 Claims, 1 Drawing Sheet

PROCESS FOR FABRICATING A MULTILAYER CERAMIC CIRCUIT BOARD

This is a continuation of application Ser. No. 07/589,215, now U.S. Pat. No. 5,176,772, filed on Sep. 28, 1990.

BACKGROUND OF THE INVENTION

1. Field of the Invention

The present invention relates to a process for fabricating a multilayer ceramic circuit board, wherein a green tape is laminated on a sintered ceramic substrate, followed by sintering, so as to avoid a distortion of the laminate due to shrinkage of the green tape during the sintering.

2. Discussion of Background

As a method for fabricating a multilayer ceramic circuit board having excellent strength, a method has been reported which comprises laminating a green tape on one side of a sintered ceramic substrate having a conductive pattern formed on its surface, then printing a conductive pattern on the surface of the green tape, and further laminating a green tape thereon (U.S. Pat. Nos. 4,645,552 and 4,799,984). However, this method requires sintering each time when a green tape is laminated. Accordingly, the number of process steps increases. The conductive pattern formed on the sintered ceramic substrate is raised from the surface of the ceramic substrate, and the green tape laminated thereon will have irregularities on its surface, whereby it will be difficult to form a fine conductive pattern on such a green tape. Further, if a defect is found in a green tape after lamination, such a tape can not be replaced, and the entire assembly of the sintered ceramic substrate and the green tape laminated thereon will be wasted. Thus, the productivity used to be poor.

SUMMARY OF THE INVENTION

It is an object of the present invention to overcome the above drawbacks of the prior art and to provide a novel process for fabricating a multilayer ceramic circuit board.

The present invention has been made to accomplish the above object and provides a process for fabricating a multilayer ceramic circuit board which comprises the steps of:

(i) providing a sintered ceramic substrate having optionally formed via holes already filled with a conductive paste or a conductive substance;

(ii) optionally applying an insulating paste layer in a prescribed pattern on one side or each side of the ceramic substrate;

(iii) then, providing a ceramic green tape and forming via holes in the green tape;

(iv) applying a conductive paste to form a conductive pattern on one side of the green tape;

(v) laminating the green tape to one side or each side of the ceramic substrate so that the conductive pattern of the green tape faces the substrate;

(vi) optionally pressing and heating the laminate from step (v); and (vii) applying a conductive paste to form a conductive pattern on the other side of the green tape and filling the via holes of the green tape with a conductive paste, before or after step (v).

DETAILED DESCRIPTION OF THE PREFERRED EMBODIMENTS

Figure 1:
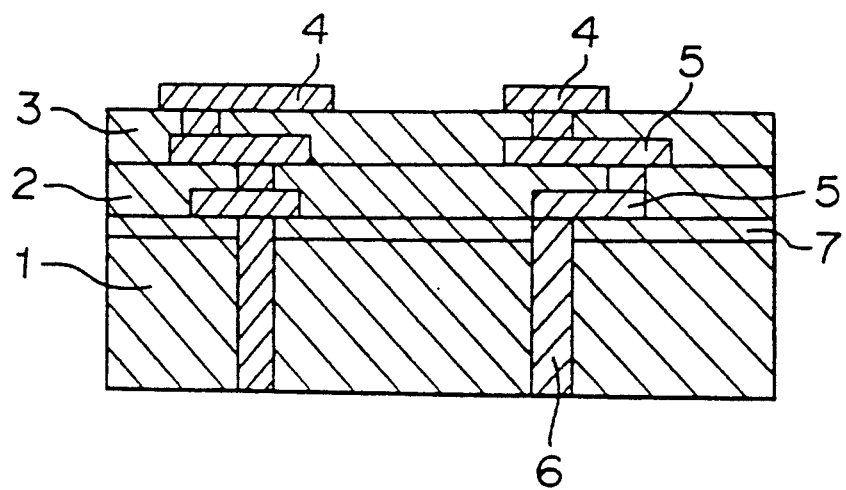
FIG. 1 is a cross sectional view illustrating the basic structure of a multilayer ceramic circuit board prepared by the process of the present invention.

Now, the present invention will be described in detail with reference to the drawing.

FIG. 1 is a cross sectional view illustrating the basic structure of a multilayer ceramic circuit board prepared by the process of the present invention.

In FIG. 1, reference numeral 1 indicates a sintered ceramic substrate. As the material for the substrate, various ceramics, specifically alumina ($Al_2O_3$), beryllia, aluminum nitride (AlN), magnesia (MgO), glass ceramics, etc., may usually be employed. Among them, from the viewpoint of strength, an alumina substrate containing from 88 to 99.5 wt % of alumina is preferred, and from the viewpoint of heat conductivity, AlN or beryllia is preferred.

Reference numerals 2 and 3 indicate green tape layers formed by lamination on the above ceramic substrate 1.

As the material for the green tape layers 2 and 3, various ceramics, specifically alumina, beryllia, AlN, MgO, glass ceramics, etc. may usually be employed, and the sintering temperature for the material is preferably lower than that for the ceramic substrate 1. If the sintering temperature for the green tape layers 2 and 3 is higher than that for the ceramic substrate 1, the ceramic substrate 1 is likely to be deformed at the time of sintering, such being undesirable. Accordingly, it is preferred to adopt a combination of a ceramic substrate 1 made of alumina and green tape layers 2 and 3 made of ceramics of borosilicate glass type, alumina-glass type, citric acid titanium tin barium type or alumina-non glass additive type, which has a sintering temperature lower than that for alumina.

Further, the strength of the material of the ceramic substrate 1 is preferably stronger than the material for the green tape layers 2 and 3. When the strength of the material for the ceramic substrate 1 is substantially the same as the substrate for the green tape layers 2 and 3, the thickness of the ceramic substrate 1 should be thicker than the thickness of the green tape layers 2 and 3.

Reference numerals 4 and 5 indicate conductive paste layers. The conductive paste to be used here is suitably selected as the case requires, for example, from copper (Cu), silver (Ag), Ag-palladium (Pd), gold (Au), platinum (Pt) and tungsten (W).

Now, the process for fabricating a multilayer ceramic circuit board according to the present invention will be described.

(i) Firstly, a sintered ceramic substrate 1 is provided which is optionally provided with via holes 6 already filled with a conductive paste or a conductive substance.

(ii) An insulating paste layer 7 is formed in a prescribed pattern on one side or each side of the ceramic substrate 1 by e.g. a printing method.

(iii) Then, a ceramic green tape 2 is provided, and via holes are formed in the green tape.

(iv) A conductive paste is applied to form a conductive pattern on one side of the green tape by e.g. a printing method.

(v) The green tape 2 is laminated to one side or each side of the ceramic substrate 1 so that the conductive pattern of the green tape 2 faces the substrate 1.

(vi) The laminate thus formed is pressed and heated, as the case requires.

(vii) A conductive paste is applied to form a conductive pattern on the other side of the green tape 2, and filling the via holes of the green tape with a conductive paste, before or after step (v). Namely, this step may be conducted before the lamination i.e. at the same time as step (iv), or may be conducted after the lamination i.e. after step (v).

(viii) When a further circuit layer is desired, a ceramic green tape having via holes formed, is laminated to the green tape on the ceramic substrate, and the laminate thereby obtained may optionally be pressed and heated.

(ix) Then, a conductive paste is applied to form a conductive pattern on the green tape laminated in step (viii) and to fill the via holes of the same green tape.

(x) Steps (viii) and (ix) may optionally be repeated until the desired number of circuit layers has been obtained.

(xi) Finally, the assembly of the ceramic substrate and the green tapes may be pressed under a pressure of from about 1 to 200 kg/cm$^2$ and heated at a temperature of from room temperature to 100° C., followed by sintering, as the case requires.

Among above steps (i) to (xi), steps (ii) may be omitted, although it is usually preferred to include such a step to improve the adhesion of the green tape to the ceramic substrate 1.

Now, another embodiment of the process for producing a ceramic circuit board according to the present invention will be described.

(i) A sintered ceramic substrate 1 is provided which may be provided with via holes already filled with a conductive paste or a conductive substance.

(ii) An insulating paste layer 7 is formed in a prescribed pattern on one side or each side of the ceramic substrate 1 by e.g. a printing method.

(iii) A conductive paste is applied in a prescribed pattern 5 on the insulating paste layer 7 on the ceramic substrate 1 by e.g. a printing method.

(iv) Then, a ceramic green tape 2 is provided, and via holes are formed in the green tape.

(v) The green tape 2 is laminated to one side or each side of the ceramic substrate 1.

(vi) The laminate thereby obtained may be pressed and heated, as the case requires.

(vii) A conductive paste is then applied to form a conductive pattern on the green tape, and the via holes of the green tape are filled with a conductive paste, before or after step (v). Namely, this step can be conducted before the lamination i.e. at the same time as step (iv), or after the lamination i.e. after step (v).

(viii) If a further circuit layer is required, a ceramic green tape 3 having via holes formed, is laminated to the green tape 2 on the ceramic substrate 1, and the laminate thereby obtained may be pressed and heated as the case requires.

(ix) A conductive paste is applied to form a conductive pattern 4 on the green tape 3 laminated in step (viii) and to fill the via holes of the same green tape 3.

(x) Steps (viii) and (ix) may be repeated until the desired number of circuit layers has been obtained.

(xi) Finally, the assembly of the ceramic substrate and the green tapes may be pressed under a pressure of from about 1 to 200 kg/cm$^2$ and heated at a temperature of from room temperature to 100° C., followed by sintering, as the case requires.

Now, a preferred material for the green tape will be described. In the following description, "%" means "% by weight".

The green tape comprises an inorganic component comprising from 40 to 90% of glass powder, from 9.99 to 60% of refractory filler and from 0.01 to 20% of an oxidizing agent. If the content of the glass powder in the inorganic component is less than 40%, the adhesion to the ceramic substrate 1 tends to be poor, and an adequately dense sintered layer tends to be hardly obtainable, whereby the electric properties tend to be poor. On the other hand, if the content exceeds 90%, the reactivity with the conductor such as copper tends to increase, and the wettability of the conductor such as copper to solder tends to be impaired, such being undesirable.

The refractory filler powder is incorporated to improve the peel strength of the conductive pattern. If the content is less than 9.99%, this peel strength tends to be poor, and if the content exceeds 60%, the sintering properties tend to be poor.

As the refractory filler, alumina alone, or a mixture of alumina ($Al_2O_3$), zircon ($ZrSiO_4$), cordierite ($Mg_2Al_4Si_5O_{18}$), forsterite ($Mg_2SiO_4$) and silica ($SiO_2$), may be used.

In the present invention, the oxidizing agent is incorporated to oxidize and remove the organic binder in the composition for forming a circuit board by firing in a non-oxidizing atmosphere at an oxygen concentration of not higher than about 10 ppm (binder-removing effects).

The oxidizing agent is added preferably in an amount of from 0.01 to 20% by weight relative to the inorganic component i.e. the total amount of the glass powder and the refractory filler. If the amount of the oxidizing agent is less than 0.01%, no adequate effects by the incorporation will be obtained. On the other hand, if it exceeds 20%, the breakdown voltage of the substrate tend to deteriorate, and the oxidizing effects during sintering against the laminated circuit portions of a conductor such as copper tend to be so strong that such circuit portions will be oxidized, such being undesirable.

As such an oxidizing agent, $CeO_2$, $TiO_2$, $BaO_2$, $SnO_2$, $CaO_2$ or $V_2O_5$ may be used. $CeO_2$ is particularly preferred.

The glass powder preferably has the following composition:

| composition: | |
| --- | --- |
| $SiO_2$ | 38–48% |
| $Al_2O_3$ | 1–8% |
| MgO | 0–10% |
| CaO | 1–8% |
| SrO | 0–15% |
| BaO | 18–28% |
| PbO | 0–20% |
| ZnO | 10–20% |
| $B_2O_3$ | 0.5–15% |
| $TiO_2 + ZrO_2$ | 0–7% |
| $Li_2O + Na_2O + K_2O$ | 0–5% |

The reason is as follows.

If the amount of $SiO_2$ is less than 38%, the dielectric constant of the sintered substrate tends to be too large, and if it exceeds 48%, the sintering temperature tends to be too high.

If the amount of $Al_2O_3$ is less than 1%, the moisture resistance of the sintered substrate tends to be poor, and if it exceeds 8%, devitrification is likely to result during the preparation of glass frit.

CaO and BaO are components for controlling the solubility and the thermal expansion coefficient for the preparation of the glass powder. The solubility of the glass powder tends to be poor if the content of CaO or BaO is less than 1% or 18%, respectively. On the other hand, if CaO or BaO exceeds 8% or 28%, respectively, the thermal expansion coefficient and the dielectric constant of the substrate tend to be too large, such being undesirable.

MgO and SrO have substantially the same effect as CaO and BaO. If MgO or SrO exceeds 10% or 15%, respectively, devitrification is likely to result when glass is melted.

By the addition of PbO, the glass softening temperature lowers, and the sintering temperature of the substrate lowers. However, if the amount exceeds 20%, the dielectric constant of the substrate tends to be too large, and the removal of the organic binder tends to be inadequate and carbon is likely to remain, such being undesirable.

$B_2O_3$ is a flux component. If the amount is less than 0.5%, no adequate effect will be obtained as a flux. If the amount of $B_2O_3$ exceeds 15%, the removal of the organic binder tends to be inadequate, and carbon is likely to remain, although the dielectric constant decreases and the electrical properties will be improved.

By the addition of ZnO, the glass softening temperature lowers, and the sintering temperature of the substrate lowers, such being desirable. However, if the amount exceeds 20%, the dielectric constant of the substrate increases, and if the amount is less than 10%, the glass softening temperature tends to be high, such being undesirable.

$TiO_2+ZrO_2$ are not essential components. However, by their addition, the crystallinity can advantageously be adjusted. If the amount exceeds 7%, the softening temperature of glass tends to be too high, or the dielectric constant of the substrate tends to be large.

$Li_2O+Na_2O+K_2O$ are not essential components, but they are preferably employed for the improvement of the solubility of glass. However, from the viewpoint of electrical migration, the amount is preferably less than 5%.

The above-mentioned refractory filler preferably has the following composition expressed by % by weight:

| | |
|---|---|
| Alumina | 10–60% |
| Zircon | 0–40% |
| Cordierite | 0–30% |
| Forsterite | 0–30% |
| Silica | 0–30% |

The reason is as follows. If alumina is less than 10%, the crystallinity of glass tends to be low, and if it exceeds 60%, the sintering properties tend to deteriorate, and the dielectric constant tends to increase.

Zircon is added to reduce and minimize the thermal expansion. However, if it exceeds 40%, the sintering properties tend to be poor.

Cordierite is incorporated to minimize the thermal expansion and to minimize the dielectric constant. However, if it exceeds 30%, the sintering properties tend to be poor.

Forsterite is incorporated to minimize the dielectric constant. However, if it is added in an amount exceeding 30%, the sintering properties tend to be poor.

Silica is added to minimize the dielectric constant. However, if it exceeds 30%, the sintering properties tend to be poor.

The green tape for the present invention may be prepared, for example, as follows.

An organic binder, a plasticizer and a solvent are added to the above described inorganic component, and the mixture is kneaded to obtain a slurry. Here, as the organic binder, a commonly employed resin such as a butyral resin or an acrylic resin may be employed. As the plasticizer, a commonly employed plasticizer such as dibutyl phthalate, dioctyl phthalate or butyl benzil phthalate, may be used; and as the solvent, a commonly employed solvent such as toluene, trichloroethylene or an alcohol may be employed.

Then, this slurry is formed into a sheet, followed by drying to obtain a non-sintered so-called green tape. The thickness of this green tape is usually from 70 to 300 μm.

Now, the insulating paste for the present invention will be described. The inorganic component for the insulating paste preferably has the same composition as the above described green tape having good adhesion to the ceramic substrate 1. However, it is not limited to such a composition, and other compositions may be used.

The insulating paste may be prepared, for example, as follows. An organic binder and a solvent are added to the same inorganic composition as used for the above described green tape, and the mixture is kneaded to obtain an insulating paste. Here, as the organic binder, ethyl cellulose, a vinyl acetate resin or an acrylic resin may be used, and as the solvent, α-terpineol or butyl carbitol may be employed.

Such an insulating paste is applied onto the above described ceramic substrate in a thickness within a range of from 5 to 50 μm by e.g. screen printing.

Now, the present invention will be described in further detail with reference to Examples. However, it should be understood that the present invention is by no means restricted to such specific Examples.

EXAMPLE 1

A glass ceramic composition comprising 58% of glass frit, 40% of alumina as filler and 2% of $CeO_2$ as oxidizing agent, was prepared. The glass frit had a composition comprising 43% of $SiO_2$, 5% of $Al_2O_3$, 5% of CaO, 27% of BaO, 15% of ZnO and 5% of $B_2O_3$.

To this glass ceramic composition, a methyl methacrylate resin as organic binder, dibutyl phthalate as plasticizer and toluene as solvent were added, and the mixture was kneaded to obtain a slurry having a viscosity of from 10,000 to 30,000 cps. Then, this slurry was formed into a sheet having a thickness of about 0.2 mm, followed by drying at 70° C. for about 2 hours. To this green tape, a copper paste was screen-printed to obtain patterns with three different line widths and spaces between lines, of 100 μm, 125 μm and 150 μm, respectively.

Then, a substrate of 96% alumina having a thickness of 0.635 mm was prepared. Via holes formed in this alumina substrate were filled with the above copper paste. Then, an insulating paste was prepared by kneading the same inorganic component as in the above green tape, ethyl cellulose as organic binder and α-terpineol as solvent, and the insulating paste was printed on each side of the alumina substrate in a thickness of 20 μm.

Then, the above green tape was laminated to each side of the ceramic substrate 1 so that the copper paste layer on the green tape faces the substrate, to obtain a laminate.

Further, the same green tape as described above is laminated to each side of this laminate. Then, a copper paste was printed on this green tape in the same manner as described above.

Then, the assembly thereby obtained was heat-pressed at 70° C. under 60 kg/cm² and sintered in a nitrogen atmosphere having an oxygen concentration of 5 ppm and a flow rate of 20 l/min at the maximum temperature of 900° C. for a peak time of 10 minutes. In this manner, 1,000 multilayer ceramic circuit boards were prepared.

With respect to all of the 1,000 multilayer ceramic circuit boards, warpage, short circuit, opencircuit, etc. were inspected, whereby no defective sheet was found.

Here, evaluation was made on the basis such that impedance between the patterned lines being not higher than $10^{14}$ was regarded as being defective.

EXAMPLE 2

Multilayer ceramic circuit boards were prepared in the same manner as in Example 1 except that the material for green tapes was as identified in Table 1. The number of boards prepared was 1,000 boards for each sample No. The results were the same as in Example 1, and all the products were free from defects.

EXAMPLE 3

Multilayer ceramic circuit boards were prepared in the same manner and in the same number of products as in Example 1 and 2 except that no insulating paste was printed to the alumina substrate.

The results were substantially the same as in Examples 1 and 2, and all the products were free from defects.

EXAMPLE 4

Multilayer ceramic circuit boards were prepared in the same manner as in Examples 1 and 2 except that a conductive paste was printed on the insulating paste on the alumina substrate, and no conductive paste was applied to the green tape for the first layer.

The results were the same as in Examples 1 and 2.

COMPARATIVE EXAMPLE 1

In Table 2, Comparative samples are shown. In this Comparative Example, 1,000 multilayer ceramic circuit boards were prepared for each sample using the material for the green tape as identified in Table 2 in the same manner as in Example 1. As shown in the column for the properties in Table 2, all the products were defective.

COMPARATIVE EXAMPLE 2

Multilayer ceramic circuit boards were prepared in the same manner and in the same number of products as in Examples 1 to 3 except that the copper paste was printed on the ceramic substrate in three different patterns with line widths and spaces between the lines being 100 μm, 125 μm and 150 μm, respectively, and no copper paste was printed on the green tape laminated first on the ceramic substrate.

The results were the same for the products of the respective sample Nos. Namely, with the pattern of 100 μm, 50% of the products were defective; with the pattern of 125 μm, 10% of the products were defective; and with the pattern of 150 μm, all the products were free from defects. The same standards as in Example 1 were employed for evaluation.

TABLE 1

| | (Examples) | | | | | | | | | |
|---|---|---|---|---|---|---|---|---|---|---|
| Sample No. | 1 | 2 | 3 | 4 | 5 | 6 | 7 | 8 | 9 | 10 |
| Composition (%) | | | | | | | | | | |
| Alumina | 8 | 18 | 28 | 38 | 48 | 58 | 20 | 25 | 38 | 38 |
| Zircon | 0 | 0 | 0 | 0 | 0 | 0 | 0 | 0 | 0 | 0 |
| Forsterite | 0 | 0 | 0 | 0 | 0 | 0 | 0 | 0 | 0 | 0 |
| Cordierite | 0 | 0 | 0 | 0 | 0 | 0 | 0 | 0 | 0 | 0 |
| Silica | 0 | 0 | 0 | 0 | 0 | 0 | 0 | 0 | 0 | 0 |
| Glass | 90 | 80 | 70 | 60 | 50 | 40 | 70 | 50 | 40 | 40 |
| Glass composition (%) | | | | | | | | | | |
| $SiO_2$ | 43 | 43 | 43 | 43 | 43 | 43 | 43 | 43 | 43 | 43 |
| $Al_2O_3$ | 5 | 5 | 5 | 5 | 5 | 5 | 5 | 5 | 5 | 5 |
| MgO | 0 | 0 | 0 | 0 | 0 | 0 | 0 | 0 | 0 | 0 |
| CaO | 5 | 5 | 5 | 5 | 5 | 5 | 5 | 5 | 5 | 5 |
| SrO | 0 | 0 | 0 | 0 | 0 | 0 | 0 | 0 | 0 | 0 |
| BaO | 27 | 27 | 27 | 27 | 27 | 27 | 27 | 27 | 27 | 27 |
| PbO | 0 | 0 | 0 | 0 | 0 | 0 | 0 | 0 | 0 | 0 |
| ZnO | 15 | 15 | 15 | 15 | 15 | 15 | 15 | 15 | 15 | 15 |
| $B_2O_3$ | 5 | 5 | 5 | 5 | 5 | 5 | 5 | 5 | 5 | 5 |
| $TiO_2 + ZrO_2$ | 0 | 0 | 0 | 0 | 0 | 0 | 0 | 0 | 0 | 0 |
| $Li_2O + Na_2O + K_2O$ | 0 | 0 | 0 | 0 | 0 | 0 | 0 | 0 | 0 | 0 |
| Oxidizing agent (%) | | | | | | | | | | |
| $CeO_2$ | 2 | 2 | 2 | 2 | 2 | 2 | 2 | 2 | 2 | 2 |
| $BaO_2$ | 0 | 0 | 0 | 0 | 0 | 0 | 0 | 0 | 0 | 0 |
| $CaO_2$ | 0 | 0 | 0 | 0 | 0 | 0 | 0 | 0 | 0 | 0 |
| Properties | | | | | | | | | | |
| WV*[1] (KV/mm) | 15 | 17 | 17 | 20 | 25 | 22 | 23 | 24 | 20 | 20 |
| IR*[2] (Ω) | $4 \times 10^{12}$ | $4 \times 10^{12}$ | $4 \times 10^{12}$ | $5 \times 10^{12}$ | $2 \times 10^{13}$ | $9 \times 10^{13}$ | $1 \times 10^{13}$ | $2 \times 10^{13}$ | $3 \times 10^{12}$ | $5 \times 10^{12}$ |
| DC*[3] | 6.7 | 6.8 | 7.0 | 7.4 | 7.5 | 7.5 | 6.7 | 7.2 | 7.1 | 6.8 |
| DCT*[4] (%) | 0.5 | 0.5 | 0.3 | 0.1 | 0.1 | 0.2 | 0.2 | 0.2 | 0.2 | 0.1 |
| Adh*[5] | Good | Good | Good | Good | Good | Good | Good | Good | Good | Good |

TABLE 1-continued (Examples)

| | | | | | | | | | | |
|---|---|---|---|---|---|---|---|---|---|---|
| Wet*6 (%) | 90 | 95 | 98 | 100 | 100 | 100 | 97 | 100 | 100 | 100 |
| Black*7 | Nil | Nil | Nil | Nil | Nil | Nil | Nil | Nil | Nil | Nil |
| RC*8 (ppm) | 360 | 240 | 240 | 180 | 170 | 170 | 240 | 170 | 120 | 120 |

| Sample No. | 11 | 12 | 13 | 14 | 15 | 16 | 17 | 18 | 19 | 20 |
|---|---|---|---|---|---|---|---|---|---|---|
| Composition (%) | | | | | | | | | | |
| Alumina | 49 | 49 | 49 | 49 | 49 | 49.97 | 49.9 | 49.5 | 49 | 45 |
| Zircon | 0 | 0 | 0 | 0 | 0 | 0 | 0 | 0 | 0 | 0 |
| Forsterite | 0 | 0 | 0 | 0 | 0 | 0 | 0 | 0 | 0 | 0 |
| Cordierite | 0 | 0 | 0 | 0 | 0 | 0 | 0 | 0 | 0 | 0 |
| Silica | 0 | 0 | 0 | 0 | 0 | 0 | 0 | 0 | 0 | 0 |
| Glass | 49 | 49 | 49 | 49 | 49 | 50 | 50.0 | 50 | 50 | 50 |
| Glass composition (%) | | | | | | | | | | |
| $SiO_2$ | 43 | 43 | 43 | 43 | 43 | 43 | 43 | 43 | 43 | 43 |
| $Al_2O_3$ | 5 | 5 | 5 | 5 | 5 | 5 | 5 | 5 | 5 | 5 |
| MgO | 0 | 0 | 0 | 0 | 0 | 0 | 0 | 0 | 0 | 0 |
| CaO | 5 | 4 | 4 | 4 | 4 | 5 | 5 | 5 | 5 | 5 |
| SrO | 0 | 0 | 0 | 0 | 0 | 0 | 0 | 0 | 0 | 0 |
| BaO | 27 | 25 | 25 | 24 | 23 | 27 | 27 | 27 | 27 | 27 |
| PbO | 0 | 0 | 0 | 0 | 0 | 0 | 0 | 0 | 0 | 0 |
| ZnO | 15 | 20 | 18 | 14 | 10 | 15 | 15 | 15 | 15 | 15 |
| $B_2O_3$ | 5 | 3 | 5 | 10 | 15 | 5 | 5 | 5 | 5 | 5 |
| $TiO_2 + ZrO_2$ | 0 | 0 | 0 | 0 | 0 | 0 | 0 | 0 | 0 | 0 |
| $Li_2O + Na_2O + K_2O$ | 0 | 0 | 0 | 0 | 0 | 0 | 0 | 0 | 0 | 0 |
| Oxidizing agent (%) | | | | | | | | | | |
| $CeO_2$ | 2 | 2 | 2 | 2 | 2 | 0.03 | 0.1 | 0.5 | 1 | 5 |
| $TiO_2$ | 0 | 0 | 0 | 0 | 0 | 0 | 0 | 0 | 0 | 0 |
| $BaO_2$ | 0 | 0 | 0 | 0 | 0 | 0 | 0 | 0 | 0 | 0 |
| $SnO_2$ | 0 | 0 | 0 | 0 | 0 | 0 | 0 | 0 | 0 | 0 |
| $CaO_2$ | 0 | 0 | 0 | 0 | 0 | 0 | 0 | 0 | 0 | 0 |
| $V_2O_5$ | 0 | 0 | 0 | 0 | 0 | 0 | 0 | 0 | 0 | 0 |
| Properties | | | | | | | | | | |
| WV*1 (KV/mm) | 15 | 25 | 26 | 19 | 15 | 15 | 16 | 18 | 19 | 25 |
| IR*2 (Ω) | $2 \times 10^{13}$ | $2 \times 10^{13}$ | $2 \times 10^{13}$ | $5 \times 10^{12}$ | $1 \times 10^{12}$ | $5 \times 10^{11}$ | $9 \times 10^{11}$ | $2 \times 10^{12}$ | $8 \times 10^{12}$ | $3 \times 10^{13}$ |
| DC*3 | 7.5 | 7.7 | 7.5 | 7.1 | 6.9 | 7.4 | 7.4 | 7.4 | 7.5 | 7.6 |
| DCT*4 (%) | 0.1 | 0.1 | 0.1 | 0.1 | 0.1 | 0.4 | 0.3 | 0.2 | 0.1 | 0.1 |
| Adh*5 | Good | Good | Good | Good | Good | Good | Good | Good | Good | Good |
| Wet*6 (%) | 100 | 100 | 100 | 100 | 100 | 100 | 100 | 100 | 100 | 100 |
| Black*7 | Nil | Nil | Nil | Nil | Nil | Nil | Nil | Nil | Nil | Nil |
| RC*8 (ppm) | 170 | 150 | 170 | 240 | 270 | 280 | 250 | 230 | 200 | 160 |

| Sample No. | 21 | 22 | 23 | 24 | 25 | 26 | 27 | 28 | 29 | 30 |
|---|---|---|---|---|---|---|---|---|---|---|
| Composition (%) | | | | | | | | | | |
| Alumina | 40 | 35 | 30 | 49 | 49 | 49 | 49 | 49 | 49 | 49 |
| Zircon | 0 | 0 | 0 | 0 | 0 | 0 | 0 | 0 | 0 | 0 |
| Forsterite | 0 | 0 | 0 | 0 | 0 | 0 | 0 | 0 | 0 | 0 |
| Cordierite | 0 | 0 | 0 | 0 | 0 | 0 | 0 | 0 | 0 | 0 |
| Silica | 0 | 0 | 0 | 0 | 0 | 0 | 0 | 0 | 0 | 0 |
| Glass | 50 | 50 | 50 | 49 | 49 | 49 | 49 | 49 | 49 | 49 |
| Glass composition (%) | | | | | | | | | | |
| $SiO_2$ | 43 | 43 | 43 | 43 | 43 | 43 | 43 | 43 | 43 | 43 |
| $Al_2O_3$ | 5 | 5 | 5 | 5 | 5 | 5 | 5 | 5 | 5 | 5 |
| MgO | 0 | 0 | 0 | 0 | 0 | 0 | 0 | 0 | 0 | 0 |
| CaO | 5 | 5 | 5 | 5 | 5 | 5 | 5 | 5 | 5 | 5 |
| SrO | 0 | 0 | 0 | 0 | 0 | 0 | 0 | 0 | 0 | 0 |
| BaO | 27 | 27 | 27 | 27 | 27 | 27 | 27 | 27 | 27 | 27 |
| PbO | 0 | 0 | 0 | 0 | 0 | 0 | 0 | 0 | 0 | 0 |
| ZnO | 15 | 15 | 15 | 15 | 15 | 15 | 15 | 15 | 13 | 12 |
| $B_2O_3$ | 5 | 5 | 5 | 5 | 5 | 5 | 5 | 5 | 5 | 5 |
| $TiO_2 + ZrO_2$ | 0 | 0 | 0 | 0 | 0 | 0 | 0 | 0 | 2 | 3 |
| $Li_2O + Na_2O + K_2O$ | 0 | 0 | 0 | 0 | 0 | 0 | 0 | 0 | 0 | 0 |
| Oxidizing agent (%) | | | | | | | | | | |
| $CeO_2$ | 10 | 15 | 20 | 0 | 0 | 0 | 0 | 0 | 2 | 2 |
| $TiO_2$ | 0 | 0 | 0 | 2 | 0 | 0 | 0 | 0 | 0 | 0 |
| $BaO_2$ | 0 | 0 | 0 | 0 | 2 | 0 | 0 | 0 | 0 | 0 |
| $SnO_2$ | 0 | 0 | 0 | 0 | 0 | 2 | 0 | 0 | 0 | 0 |
| $CaO_2$ | 0 | 0 | 0 | 0 | 0 | 0 | 2 | 0 | 0 | 0 |
| $V_2O_5$ | 0 | 0 | 0 | 0 | 0 | 0 | 0 | 2 | 0 | 0 |
| Properties | | | | | | | | | | |
| WV*1 (KV/mm) | 27 | 30 | 30 | 18 | 17 | 17 | 16 | 16 | 24 | 25 |
| IR*2 (Ω) | $4 \times 10^{13}$ | $1 \times 10^{14}$ | $1 \times 10^{14}$ | $1 \times 10^{13}$ | $1 \times 10^{13}$ | $8 \times 10^{12}$ | $1 \times 10^{12}$ | $1 \times 10^{12}$ | $2 \times 10^{13}$ | $3 \times 10^{13}$ |
| DC*3 | 7.9 | 8.1 | 8.2 | 7.5 | 7.5 | 7.5 | 7.4 | 7.4 | 7.6 | 7.7 |
| DCT*4 (%) | 0.3 | 0.5 | 0.8 | 0.2 | 0.2 | 0.2 | 0.2 | 0.2 | 0.1 | 0.1 |
| Adh*5 | Good | Good | Good | Good | Good | Good | Good | Good | Good | Good |
| Wet*6 (%) | 100 | 100 | 100 | 100 | 100 | 100 | 100 | 100 | 100 | 100 |

TABLE 1-continued (Examples)

| | | | | | | | | | | |
|---|---|---|---|---|---|---|---|---|---|---|
| Black*7 | Nil | Nil | Nil | Nil | Nil | Nil | Nil | Nil | Nil | Nil |
| RC*8 (ppm) | 140 | 100 | 100 | 300 | 310 | 310 | 340 | 340 | 170 | 180 |
| Sample No. | 31 | 32 | 33 | 34 | 35 | 36 | 37 | 38 | 39 | 40 |
| Composition (%) | | | | | | | | | | |
| Alumina | 49 | 49 | 49 | 49 | 49 | 49 | 49 | 49 | 28 | 38 |
| Zircon | 0 | 0 | 0 | 0 | 0 | 0 | 0 | 0 | 0 | 0 |
| Forsterite | 0 | 0 | 0 | 0 | 0 | 0 | 0 | 0 | 0 | 0 |
| Cordierite | 0 | 0 | 0 | 0 | 0 | 0 | 0 | 0 | 0 | 0 |
| Silica | 0 | 0 | 0 | 0 | 0 | 0 | 0 | 0 | 0 | 0 |
| Glass | 49 | 49 | 49 | 49 | 49 | 49 | 49 | 49 | 70 | 60 |
| Glass composition (%) | | | | | | | | | | |
| $SiO_2$ | 43 | 43 | 43 | 43 | 43 | 43 | 43 | 43 | 43 | 38 |
| $Al_2O_3$ | 5 | 5 | 5 | 5 | 5 | 5 | 5 | 5 | 5 | 5 |
| MgO | 0 | 0 | 0 | 0 | 0 | 0 | 0 | 0 | 0 | 0 |
| CaO | 5 | 5 | 5 | 5 | 5 | 4 | 4 | 4 | 4 | 4 |
| SrO | 0 | 0 | 0 | 0 | 0 | 0 | 0 | 0 | 0 | 0 |
| BaO | 27 | 27 | 27 | 27 | 27 | 25 | 25 | 25 | 25 | 25 |
| PbO | 0 | 0 | 0 | 0 | 0 | 2 | 5 | 10 | 10 | 15 |
| ZnO | 10 | 8 | 13 | 12 | 10 | 18 | 15 | 10 | 10 | 10 |
| $B_2O_3$ | 5 | 5 | 5 | 5 | 5 | 5 | 5 | 5 | 5 | 5 |
| $TiO_2 + ZrO_2$ | 5 | 7 | 0 | 0 | 0 | 0 | 0 | 0 | 0 | 0 |
| $Li_2O + Na_2O + K_2O$ | 0 | 0 | 2 | 3 | 5 | 0 | 0 | 0 | 0 | 0 |
| Oxidizing agent (%) | | | | | | | | | | |
| $CeO_2$ | 2 | 2 | 2 | 2 | 2 | 2 | 2 | 2 | 2 | 2 |
| $TiO_2$ | 0 | 0 | 0 | 2 | 0 | 0 | 0 | 0 | 0 | 0 |
| $BaO_2$ | 0 | 0 | 0 | 0 | 0 | 0 | 0 | 0 | 0 | 0 |
| $SnO_2$ | 0 | 0 | 0 | 0 | 0 | 0 | 0 | 0 | 0 | 0 |
| $CaO_2$ | 0 | 0 | 0 | 0 | 0 | 0 | 0 | 0 | 0 | 0 |
| $V_2O_5$ | 0 | 0 | 0 | 0 | 0 | 0 | 0 | 0 | 0 | 0 |
| Properties | | | | | | | | | | |
| WV*1 (KV/mm) | 25 | 24 | 22 | 22 | 20 | 25 | 23 | 20 | 17 | 17 |
| IR*2 (Ω) | $2 \times 10^{13}$ | $2 \times 10^{13}$ | $9 \times 10^{12}$ | $9 \times 10^{12}$ | $5 \times 10^{12}$ | $2 \times 10^{13}$ | $7 \times 10^{12}$ | $4 \times 10^{12}$ | $3 \times 10^{12}$ | $2 \times 10^{12}$ |
| DC*3 | 7.7 | 7.7 | 7.6 | 7.7 | 7.9 | 7.5 | 7.6 | 7.9 | 7.9 | 8.0 |
| DCT*4 (%) | 0.1 | 0.1 | 0.2 | 0.2 | 0.3 | 0.1 | 0.1 | 0.1 | 0.2 | 0.2 |
| Adh*5 | Good | Good | Good | Good | Good | Good | Good | Good | Good | Good |
| Wet*6 (%) | 100 | 100 | 100 | 100 | 100 | 100 | 100 | 100 | 97 | 100 |
| Black*7 | Nil | Nil | Nil | Nil | Nil | Nil | Nil | Nil | Nil | Nil |
| RC*8 (ppm) | 170 | 170 | 180 | 200 | 210 | 190 | 210 | 230 | 310 | 290 |
| Sample No. | 41 | 42 | 43 | 44 | 45 | 46 | 47 | 48 | 49 | 50 |
| Composition (%) | | | | | | | | | | |
| Alumina | 48 | 28 | 38 | 48 | 58 | 38 | 38 | 28 | 49 | 49 |
| Zircon | 0 | 0 | 0 | 0 | 0 | 10 | 0 | 10 | 0 | 0 |
| Forsterite | 0 | 0 | 0 | 0 | 0 | 0 | 0 | 0 | 0 | 0 |
| Cordierite | 0 | 0 | 0 | 0 | 0 | 0 | 10 | 0 | 0 | 0 |
| Silica | 0 | 0 | 0 | 0 | 0 | 0 | 10 | 0 | 0 | 0 |
| Glass | 50 | 70 | 60 | 50 | 40 | 50 | 40 | 60 | 49 | 49 |
| Glass composition (%) | | | | | | | | | | |
| $SiO_2$ | 33 | 43 | 43 | 43 | 43 | 40 | 47 | 40 | 43 | 43 |
| $Al_2O_3$ | 5 | 5 | 5 | 5 | 5 | 7 | 6 | 7 | 5 | 5 |
| MgO | 0 | 0 | 0 | 0 | 0 | 0 | 0 | 0 | 2 | 5 |
| CaO | 4 | 6 | 6 | 6 | 6 | 7 | 2 | 7 | 5 | 5 |
| SrO | 0 | 0 | 0 | 0 | 0 | 0 | 0 | 0 | 0 | 0 |
| BaO | 25 | 23 | 23 | 23 | 23 | 27 | 27 | 27 | 27 | 27 |
| PbO | 20 | 0 | 0 | 0 | 0 | 0 | 0 | 0 | 0 | 0 |
| ZnO | 10 | 17 | 17 | 17 | 17 | 17 | 12 | 19 | 13 | 10 |
| $B_2O_3$ | 5 | 4 | 4 | 4 | 4 | 2 | 6 | 0 | 0 | 5 |
| $TiO_2 + ZrO_2$ | 5 | 0 | 0 | 0 | 0 | 0 | 0 | 0 | 0 | 0 |
| $Li_2O + Na_2O + K_2O$ | 0 | 0 | 0 | 0 | 0 | 0 | 0 | 0 | 0 | 0 |
| Oxidizing agent (%) | | | | | | | | | | |
| $CeO_2$ | 2 | 0 | 2 | 2 | 2 | 2 | 2 | 2 | 2 | 2 |
| $TiO_2$ | 0 | 0.5 | 0 | 2 | 0 | 0 | 0 | 0 | 0 | 0 |
| $BaO_2$ | 0 | 0 | 0 | 0 | 0 | 0 | 0 | 0 | 0 | 0 |
| $SnO_2$ | 0 | 0 | 0 | 0 | 0 | 0 | 0 | 0 | 0 | 0 |
| $CaO_2$ | 0 | 0 | 0 | 0 | 0 | 0 | 0 | 0 | 0 | 0 |
| $V_2O_5$ | 0 | 1.5 | 0 | 0 | 0 | 0 | 0 | 0 | 0 | 0 |
| Properties | | | | | | | | | | |
| WV*1 (KV/mm) | 15 | 17 | 18 | 20 | 24 | 21 | 25 | 25 | 25 | 27 |
| IR*2 (Ω) | $1 \times 10^{12}$ | $1 \times 10^{12}$ | $5 \times 10^{12}$ | $1 \times 10^{13}$ | $4 \times 10^{13}$ | $3 \times 10^{13}$ | $5 \times 10^{13}$ | $6 \times 10^{13}$ | $2 \times 10^{13}$ | $1 \times 10^{13}$ |
| DC*3 | 8.2 | 7.2 | 7.4 | 7.5 | 7.8 | 7.2 | 7.4 | 7.9 | 7.5 | 7.5 |
| DCT*4 (%) | 0.2 | 0.3 | 0.1 | 0.1 | 0.2 | 0.3 | 0.2 | 0.1 | 0.1 | 0.1 |
| Adh*5 | Good | Good | Good | Good | Good | Good | Good | Good | Good | Good |
| Wet*6 (%) | 100 | 100 | 100 | 100 | 100 | 100 | 100 | 100 | 100 | 100 |
| Black*7 | Nil | Nil | Nil | Nil | Nil | Nil | Nil | Nil | Nil | Nil |

TABLE 1-continued

| RC*8 (ppm) | (Examples) | | | | | | | | |
|---|---|---|---|---|---|---|---|---|---|
| | 400 | 350 | 270 | 210 | 160 | 150 | 170 | 100 | 180 | 190 |
| Sample No. | 51 | 52 | 53 | 54 | 55 | 56 | 57 | 58 | 59 |
| Composition (%) | | | | | | | | | |
| Alumina | 49 | 49 | 49 | 49 | 49 | 49 | 49 | 49 | 49 |
| Zircon | 0 | 0 | 0 | 0 | 0 | 0 | 0 | 0 | 0 |
| Forsterite | 0 | 0 | 0 | 0 | 0 | 0 | 0 | 0 | 0 |
| Cordierite | 0 | 0 | 0 | 0 | 0 | 0 | 0 | 0 | 0 |
| Silica | 0 | 0 | 0 | 0 | 0 | 0 | 0 | 0 | 0 |
| Glass | 49 | 49 | 49 | 49 | 49 | 49 | 49 | 49 | 49 |
| Glass composition (%) | | | | | | | | | |
| $SiO_2$ | 40 | 38 | 43 | 43 | 40 | 37 | 45 | 43 | 38 |
| $Al_2O_3$ | 5 | 5 | 5 | 5 | 5 | 5 | 8 | 8 | 8 |
| MgO | 8 | 10 | 0 | 0 | 0 | 0 | 0 | 0 | 0 |
| CaO | 5 | 5 | 5 | 5 | 5 | 5 | 5 | 5 | 8 |
| SrO | 0 | 0 | 2 | 5 | 8 | 12 | 0 | 0 | 0 |
| BaO | 27 | 27 | 27 | 27 | 27 | 27 | 20 | 15 | 18 |
| PbO | 0 | 0 | 0 | 0 | 0 | 0 | 0 | 0 | 0 |
| ZnO | 10 | 10 | 13 | 10 | 10 | 10 | 17 | 20 | 20 |
| $B_2O_3$ | 5 | 5 | 5 | 5 | 5 | 5 | 5 | 5 | 5 |
| $TiO_2 + ZrO_2$ | 0 | 0 | 0 | 2 | 3 | 5 | 0 | 0 | 0 |
| $Li_2O + Na_2O + K_2O$ | 0 | 0 | 0 | 0 | 0 | 0 | 0 | 0 | 0 |
| Oxidizing Agent (%) | | | | | | | | | |
| $CeO_2$ | 2 | 2 | 2 | 2 | 2 | 2 | 2 | 2 | 2 |
| Properties | | | | | | | | | |
| WV*1 (KV/mm) | 28 | 29 | 25 | 25 | 26 | 22 | 31 | 30 | 25 |
| IR*2 (Ω) | $2 \times 10^{13}$ | $2 \times 10^{13}$ | $2 \times 10^{13}$ | $1 \times 10^{13}$ | $2 \times 10^{13}$ | $1 \times 10^{13}$ | $5 \times 10^{13}$ | $5 \times 10^{13}$ | $1 \times 10^{13}$ |
| DC*3 | 7.7 | 7.7 | 7.6 | 7.7 | 7.8 | 7.8 | 7.4 | 7.2 | 7.6 |
| DCT*4 (%) | 0.2 | 0.2 | 0.1 | 0.1 | 0.1 | 0.2 | 0.1 | 0.1 | 0.1 |
| Adh*5 | Good | Good | Good | Good | Good | z | Good | Good | Good |
| Wet*6 (%) | 100 | 100 | 100 | 100 | 100 | 100 | 100 | 100 | 100 |
| Black*7 | Nil | Nil | Nil | Nil | Nil | Nil | Nil | Nil | Nil |
| RC*8 (ppm) | 200 | 220 | 170 | 160 | 170 | 200 | 150 | 150 | 180 |

*1WV: Breakdown voltage
*2IR: Insulating resistance
*3DC: Dielectric constant
*4DLT: Dielectric loss tangent
*5Adh: Adhesion to the substrate
*6Wet: Wettability of the conductor to solder
*7Black: Balckening
*8RC: Residual carbon

TABLE 2

| Sample No. | (Comparative Examples) | | | |
|---|---|---|---|---|
| | 1 | 2 | 3 | 4 |
| Composition (%) | | | | |
| Alumina | 3 | 68 | 50 | 49 |
| Zircon | 0 | 0 | 0 | 0 |
| Forsterite | 0 | 0 | 0 | 0 |
| Cordierite | 0 | 0 | 0 | 0 |
| Silica | 0 | 0 | 0 | 0 |
| Glass | 95** | 30** | 50 | 49 |
| Glass composition (%) | | | | |
| $SiO_2$ | 43 | 43 | 43 | 35 |
| $Al_2O_3$ | 5 | 5 | 5 | 15 |
| MgO | 0 | 0 | 0 | 0 |
| CaO | 5 | 5 | 5 | 5 |
| SrO | 0 | 0 | 0 | 0 |
| BaO | 27 | 27 | 27 | 20 |
| PbO | 0 | 0 | 0 | 10 |
| ZnO | 15 | 15 | 15 | 0 |
| $B_2O_3$ | 5 | 5 | 5 | 15 |
| $TiO_2 + ZrO_2$ | 0 | 0 | 0 | 0 |
| $Li_2O + Na_2O + K_2O$ | 0 | 0 | 0 | 0 |
| Oxidizing agent (%) | | | | |
| $CeO_2$ | 2 | 2 | 0** | 2 |
| $BaO_2$ | 0 | 0 | 0 | 0 |
| $CaO_2$ | 0 | 0 | 0 | 0 |
| Properties | | | | |
| WV*1 (KV/mm) | 15 | 24 | 1.1 | 10 |
| IR*2 (Ω) | $1 \times 10^{12}$ | $1 \times 10^{14}$ | $2 \times 10^{11}$ | $2 \times 10^{12}$ |
| DC*3 | 6.5 | 7.7 | 7.3 | 7.0 |
| DCT*4 (%) | 0.7 | 0.5 | 0.7 | 0.8 |
| Adh*5 | Good | Poor** | Good | Good |
| Wet*6 (%) | 85 | 100 | 90 | 100 |
| Black*7 | Nil | Nil | Yes** | Nil |
| RC*8 (ppm) | 390 | 110 | 2300 | 230 |

: Symbol  indicates a "defect".
*1WV: Breakdown voltage
*2IR: Insulating resistance
*3DC: Dielectric constant
*4DLT: Dielectric loss tangent
*5Adh: Adhesion to the substrate
*6Wet: Wettability of the conductor to solder
*7Black: Balckening
*8RC: Residual carbon According to the present invention, a green tape having a conductive paste formed thereon is laminated on a sintered ceramic substrate, whereby the following effects and advantages can be obtained.

1) A conductive paste is applied to a green tape or to an insulating paste layer. This is advantageous over a case where the conductive paste is applied to the sintered ceramic substrate in that the solvent contained in the conductive paste does not diffuse on the surface of the green tape or the insulating paste layer, and accordingly a fine pattern can readily be formed. Further, when a resistant paste or the like is to be formed on the green tape or the insulating paste layer, failure can be reduced.

2) When a conductive paste is applied to green tapes, the green tapes having the conductive paste applied thereon can be inspected before lamination, and only green tapes found acceptable by the inspection will be used, whereby the yield can be improved, and the productivity will be improved accordingly.

3) When an insulating paste layer is formed on the ceramic substrate, the adhesion of the green tape to the ceramic substrate can thereby be improved.

Further, the green tape or the insulating paste used in the present invention not only exhibits excellent electrical properties but also exhibits excellent adhesive strength to the ceramic substrate by virtue of the glass component contained in the green tape or in the insulating paste, whereby it is possible to provide an excellent multilayer ceramic circuit board free from interlaminar peeling.

What is claimed is:

1. A process for fabricating a multilayer ceramic circuit board which comprises the steps of:
   (i) providing a sintered ceramic substrate having optionally formed via holes already filled with a conductive paste or a conductive substance;
   (ii) printing an insulating paste layer in a prescribed pattern on one side or each side of the ceramic substrate;
   (iii) applying a conductive paste in a prescribed pattern on the insulating paste layer on the ceramic substrate;
   (iv) then, providing a ceramic green tape and forming via holes in the green tape;
   (v) laminating the green tape to the insulating paste layer having a conductive paste in a prescribed pattern thereon;
   (vi) optionally pressing and heating the laminate from step (v);
   (vii) applying a conductive paste to the green tape to form a conductive pattern and filling the via holes of the green tape with a conductive paste, before or after step (v);
   (viii) laminating to the green tape on the ceramic substrate a ceramic green tape having via holes formed, and optionally pressing and heating the laminate;
   (ix) applying a conductive paste to the green tape laminated in sep (viii) to form a conductive pattern and to fill the via holes of the same green tape;
   (x) optionally repeating steps (viii) and (ix) until the desired number of circuit layers has been obtained; and
   (xi) finally pressing and sintering the assembly of the ceramic substrate and the green tapes.

2. The process according to claim 1, wherein the ceramic substrate is made of alumina, beryllia, MgO or AlN.

3. The process according to claim 1, wherein the ceramic substrate is an alumina substrate containing from 88 to 99.5 wt % of alumina.

4. The process according to claim 1, wherein the green tape contains glass.

5. The process according to claim 1, wherein the green tape comprises an inorganic component comprising glass, refractory filler and an oxidizing agent, and sintering is conducted in a substantially non-oxidizing atmosphere.

6. The process according to claim 1, wherein the green tape comprises an inorganic component comprising from 40 to 90 wt % of glass powder, from 9.99 to 60 wt % of refractory filler and from 0.01 to 20 wt % of an oxidizing agent, wherein the glass powder consists essentially of from 38 to 48 wt % of $SiO_2$, from 1 to 8 wt % of $Al_2O_3$, from 0 to 10 wt % of $MgO$, from 1 to 8 wt % of $CaO$, from 0 to 15 wt % of $SrO$, from 18 to 28 wt % of $BaO$, from 0 to 20 wt % of $PbO$, from 10 to 20 wt % of $ZnO$, from 0.5 to 15 wt % of $B_2O_3$, from 0 to 7 wt % of $TiO_2+ZrO_2$ and from 0 to 5 wt % of $Li_2O+Na_2O+K_2O$, and sintering is conducted in a substantially non-oxidizing atmosphere.

7. A process for fabricating a multilayer ceramic circuit board which comprises the steps of:
   (i) providing a sintered ceramic substrate having optionally formed via holes already filled with a conductive paste or a conductive substance;
   (ii) printing an insulating paste layer in a prescribed pattern on one side or each side of the ceramic substrate;
   (iii) applying a conductive paste in a prescribed pattern on any insulating paste layer printed in step (ii) on the ceramic substrate;
   (iv) then, providing a ceramic green tape and forming via holes in the green tape;
   (v) laminating the green tape to the insulating paste layer on one side or each side of the ceramic substrate;
   (vi) pressing and heating the laminate from step (v);
   (vii) applying a conductive paste to form a conductive pattern on the green tape and filling the via holes of the green tape with a conductive paste, before or after step (v); and
   (viii) finally sintering the laminate.

8. The process according to claim 7, wherein the ceramic substrate is made of alumina, beryllia, MgO or AlN.

9. The process according to claim 7, wherein an insulating paste layer is printed in a prescribed pattern on one side or each side of the ceramic substrate.

* * * * *